(12) United States Patent
Kuwano et al.

(10) Patent No.: US 6,528,442 B1
(45) Date of Patent: Mar. 4, 2003

(54) OPTICAL TRANSPARENT FILM AND SPUTTERING TARGET FOR FORMING OPTICAL TRANSPARENT FILM

(75) Inventors: Katsuo Kuwano, Ibaraki-ken (JP); Hideo Takami, Ibaraki-ken (JP)

(73) Assignee: Nikko Materials Company, Limited, Tokyo (JP)

( * ) Notice: Subject to any disclaimer, the term of this patent is extended or adjusted under 35 U.S.C. 154(b) by 0 days.

(21) Appl. No.: 09/719,018

(22) PCT Filed: Aug. 12, 1999

(86) PCT No.: PCT/JP99/04365

§ 371 (c)(1),
(2), (4) Date: Dec. 7, 2000

(87) PCT Pub. No.: WO01/13371

PCT Pub. Date: Feb. 22, 2001

(51) Int. Cl.[7] ............... C03C 3/12; C03C 3/14; C03C 3/16; C03C 3/17; C03C 3/19

(52) U.S. Cl. .............. 501/41; 501/1; 501/45; 501/46; 501/47; 501/48; 501/49; 501/73; 501/77; 501/134; 501/153; 501/154; 204/192.22; 204/192.23; 204/192.29; 204/192.26; 428/64.4; 428/64.5; 428/64.6; 428/433; 428/450

(58) Field of Search .............. 501/41, 45, 46–49, 501/52, 73, 77, 134, 153, 154, 1; 204/192.22, 192.23, 192.29, 192.26; 428/64.4, 64.5, 64.6, 433, 450

(56) References Cited

U.S. PATENT DOCUMENTS 5,532,062 A * 7/1996 Miyazaki et al.
5,736,267 A * 4/1998 Mitsui et al.

FOREIGN PATENT DOCUMENTS

| EP | 877006 A | * | 11/1998 |
|----|----------|---|---------|
| JP | 60-45952 | | 3/1985 |
| JP | 02-206587 | | 8/1990 |
| JP | 03-152736 | | 6/1991 |
| JP | 06002130 A | * | 1/1994 |
| JP | 06128743 A | * | 5/1994 |
| JP | 06293956 A | * | 10/1994 |
| JP | 10306367 A | * | 11/1998 |
| JP | 11171539 A | * | 6/1999 |
| JP | 11-185294 | | 7/1999 |

OTHER PUBLICATIONS

Two pages of English Abstract of JP 11–185294, Jul. 1999.
Two pages of English Abstract of JP 03–152736, Jun. 1991.
Two pages of English Abstract of JP 02–206587, Aug. 1990.
Two pages of English Abstract of JP 60–45952, Mar. 1985.

* cited by examiner

*Primary Examiner*—David Sample
(74) *Attorney, Agent, or Firm*—Howson and Howson

(57) ABSTRACT

To provide an optically transparent film containing 0.01 to 20% by weight glass forming oxide consisting of $Nb_2O_5$, $V_2O_5$, $B_2O_3$, $SiO_2$, and $P_2O_6$; 0.01 to 20% by weight $Al_2O_3$ or $Ga_2O_3$; and 0.01 to 5% by weight hard oxide of $ZrO_2$ and $TiO_2$ as required; balance being ZnO, and a sputtering target for forming such a film. This sputtering target reduces occurrence of particles during sputtering, decreases the number of interruption or discontinuance of sputtering to improve production efficiency, and forms a protective film for optical disks with large transmittance and low reflectance.

7 Claims, 2 Drawing Sheets

OPTICAL TRANSPARENT FILM AND SPUTTERING TARGET FOR FORMING OPTICAL TRANSPARENT FILM

FIELD OF THE INVENTION

The present invention relates to an optically transparent film especially used in a protective film (hereafter including a material expressed as a "layer") for optical disks, more specifically to an optically transparent film that can decrease the number of particles formed during the formation of a film with sputtering, that has a high transmittance in the visible region of the formed film, and that is suitable for an optical disk having a low reflectance, in particular for a phase-change type optical disk; and a sputtering target for forming such a film.

BACKGROUND OF THE INVENTION

In recent years, high-density optical disks have rapidly attracted public interests because they can record and play without the need of magnetic heads.

These optical disks are classified into three types: the read-only type, the write-once type, and the rewritable type, and the phase-change system used in the write-once type and the rewritable type has particularly attracted public attention. The principle of writing and reading using such a phase-change type optical disk will be described briefly below.

A phase-change type optical disk is used for writing and reading information by heating the recording layer on a substrate by the irradiation of laser beams, and causing crystallographic phase change (between amorphous and crystalline phases) to occur in the structure of the recording layer. More specifically, information is read by sensing change in reflectance caused by change in optical constants between the phases.

The above-described phase change is caused by the irradiation of laser beams narrowed down to a diameter of 1 to several microns. In this case, for example, if laser beams of a diameter of 1 $\mu$m pass at a linear velocity of 10 m/s, the time that a certain spot on the optical disk is irradiated is 100 ns, in which the above-described phase change and reflectance must be sensed.

For realizing the above-described crystallographic phase change, i.e. phase change between amorphous and crystalline phases, the heat of melting and quenching is imparted not only to the phase-change recording layer of the optical disk, but also to the surrounding protective film and the reflective film of an aluminum alloy repeatedly.

From these facts, as FIG. 1 shows, the phase-change optical disk has a four-layer structure in which a Ge—Sb—Te-based recording thin film 4 or the like is sandwiched by protective films 3 and 5 of a ZnS—SiO$_2$-based high-melting-point dielectric, and further a reflective film 6 of an aluminum alloy is disposed.

Among these, the reflective film 6 and protective films 3, 5 is required to have optical functions to increase the absorption of amorphous and crystalline portions, and to increase difference in reflectance, as well as the function to prevent the distortion of the recording film 4 due to damp-proof or heat, and the function to control the thermal conditions on recording (see "Kogaku (Optics)," Vol. 26, No. 1, pp. 9–15).

As described above, the high melting-point protective films 3, 5 must be resistant to repetitive thermal stress of heating and cooling, the reflective film and other components must not be affected by these thermal effects, and the protective films themselves must be thin and low reflective, and must not be deteriorated. In this sense, the protective films 3, 5 play an important role.

In FIG. 1, the symbol 1 represents the laser incident direction, 2 represents a substrate of polycarbonate or the like, 7 represents an overcoat, and 8 represents an adhesive layer.

The above-described protective films 3 and 5 are normally formed by the sputtering method. In this sputtering method, a positive electrode and a target consisting of a negative electrode is made to face to each other, and a high voltage is input between the substrate and the target in an inert gas atmosphere to create an electric field. The method uses the principle in which electrons impinge against the inert gas to form plasma, anions in the plasma impinge on the surface of the target (negative electrode) to knock on atoms constituting the target, and these knock-on atoms are deposited on the facing surface of the substrate to form a film.

As the target for forming the above-described protective films, a ZnS—SiO$_2$ sputtering target, manufactured by sintering the mixed powder of SiO$_2$ powder and ZnS powder, has been used.

In the stage of forming thin films by sputtering using a ZnS—SiO$_2$ sputtering target, when the quantity of coating exceed a certain level, cluster-like coarse grains, known as particles, are deposited on the thin film. The main cause of the formation of these particles is that the mist produced by sputtering deposit on the walls of the sputtering chamber and on various apparatuses, it is peeled off as debris when the quantity exceeds a certain level, the debris float within the sputtering chamber, and deposit again on the substrate or the thin film.

Since these particles degrade the properties of the thin film, sputtering must be once suspended in the stage when a large quantity of the particles deposit on the substrate or the thin film, and the sputtering chamber must be opened to remove deposits of the film that cause particles to be formed on the walls of the sputtering chamber and on various apparatuses.

This lowers productivity significantly. Although the reason why these deposits of the film adhere on the walls of the sputtering chamber and on various apparatuses has not been well known, the cause-result relationship has been estimated in the manufacturing process of the ZnS—SiO$_2$ target, specifically, the mixing and sintering steps of SiO$_2$ powder and ZnS powder. However, the solution more than the estimation has not been found.

Also, although the protective films formed by sputtering have been required to have a reflectance as low as possible, the feasibility of the improvement in the steps of the manufacturing process of the ZnS—SiO$_2$ target has not been sufficiently studied.

Especially, the large problem of the above-described conventional ZnS—SiO$_2$ target is that direct current sputtering cannot be performed because these materials are insulators. Therefore, low-efficiency methods such as high frequency (RF) sputtering must be used. These methods require sputtering for a long time to obtain a desired thickness, and raise an unfavorable problem that the number of particles, which must be decreased, are rather increased.

OBJECTS OF THE INVENTION

The present invention solves the above problems by fundamentally reviewing sputtering target materials to reduce the formation of particles as much as possible, to decrease the frequency of interruption or discontinuance of sputtering to improve production efficiency, and to obtain a protective film for optical disks having a large transmittance and a low reflectance.

SUMMARY OF THE INVENTION

According to the present invention, there are provided 1) an optically transparent film containing 0.01 to 20% by weight one or more glass forming oxide selected from a group consisting of $Nb_2O_5$, $V_2O_5$, $B_2O_3$, $SiO_2$, and $P_2O_5$, 0.01 to 20% by weight $Al_2O_3$ or $Ga_2O_3$; balance being ZnO; 2) the optically transparent film according to the above-described 1), further containing 0.01 to 5% by weight hard oxide of $ZrO_2$ and/or $TiO_2$; 3) a sputtering target for forming an optically transparent film containing 0.01 to 20% by weight one or more glass forming oxide selected from a group consisting of $Nb_2O_5$, $V_2O_5$, $B_2O_3$, $SiO_2$, and $P_2O_5$; 0.01 to 20% by weight $Al_2O_3$ or $Ga_2O_3$; balance being ZnO; and 4) the sputtering target for forming an optically transparent film according to the above-described 3), further containing 0.01 to 5% by weight hard oxide of $ZrO_2$ and/or $TiO_2$.

DETAILED DESCRIPTION OF THE PREFERRED EMBODIMENT

Figure 1:
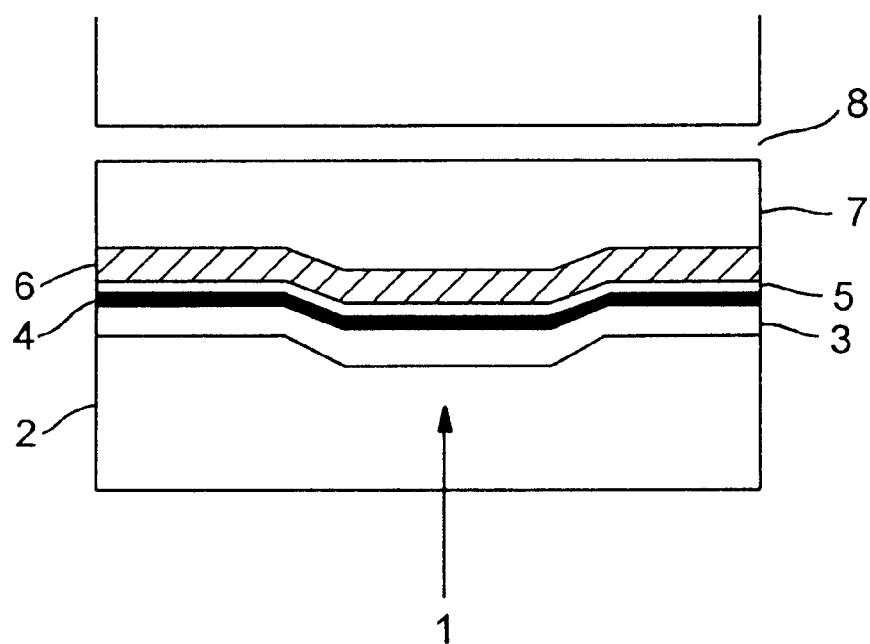
FIG. 1 is an explanatory sectional view showing a layered structure of thin films for recording.

When the optically transparent film of the present invention is used as an optical disk protective film, the sputtering target for forming the film is manufactured by mixing and sintering by hot pressing, HIP, or the like the powders of ZnO as the main component, 0.01 to 20% by weight of one or more glass forming oxide selected from a group consisting of $Nb_2O_5$, $V_2O_5$, $B_2O_3$, $SiO_2$, and $P_2O_5$, 0.01 to 20% by weight $Al_2O_3$ and/or $Ga_2O_3$, and as required, 0.01 to 5% by weight hard oxide of $ZrO_2$ and/or $TiO_2$.

The addition of 0.01 to 20% by weight of at least one of glass forming oxide selected from a group consisting of $Nb_2O_5$, $V_2O_5$, $B_2O_3$, $SiO_2$, and $P_2O_5$ is to inhibit crystallization effectively, and to form a stable optical disk protective layer.

The addition of less than 0.01% by weight of the oxide is not effective, and the addition exceeding 20% by weight causes the crystal phase of the added component to precipitate. For the above reasons, the range of addition of the above-described oxide is preferably between 0.01 and 20% by weight.

Further, the reason why the content of $Al_2O_3$ and/or $Ga_2O_3$ is 0.01 to 20% by weight is that these oxides lower the bulk electrical resistance of the target, enable direct-current (DC) sputtering, and can maintain the transmittance of the thin film for the protective layer in the visible ray region (360–830 nm) at 80% or more.

The addition of less than 1.01% by weight of the oxide is not effective, and the addition exceeding 20% by weight causes the tendency of electrical insulation to occur, makes stable DC sputtering difficult, and lowers the transmittance of the thin film for the protective layer in the visible ray region.

As required, 0.01 to 5% by weight of hard oxides of $ZrO_2$ and/or $TiO_2$ may be added to reinforce the film.

The protective film formed using the above ZnO-based sputtering target for optical disk protective films has a transmittance of 80% or more in the visible region (360–830 nm), and a reflectance of 20% or less. These values are sufficient for optical disk protective films.

The above ZnO-based sputtering target for optical disk protective films of the present invention can significantly reduce the formation of particles compared with conventional ZnS—$SiO_2$ targets. The reason is considered that ZnO and the additives themselves have larger adhesive force to the internal walls of the chamber and to the apparatus than ZnS.

By thus reducing the formation of particles, since the number of interruption or discontinuance of sputtering decreases, and the frequency of troublesome cleaning of the sputtering chamber decreases, the present invention has the effect of dramatically elevating the production efficiency compared with the conventional sputtering targets.

In addition, the use of the ZnO-based sputtering target for optical disk protective films not only provides the above-described low-reflectance films, but also provides at high reproducibility the stable ZnO-based optical disk protective films (layers) that satisfy optical functions to increase the absorption of the amorphous and crystalline portions and increase the difference in reflectance, the function to prevent the deformation of recording thin films due to damp-proof or heat, and the function to control the thermal conditions during recording.

EXAMPLES AND COMPARATIVE EXAMPLES

The present invention will be described in detail below referring to Examples and Comparative Examples. These examples are solely shown for explanation, and are not intended to limit the present invention. Specifically, the present invention is limited only by the attached claims, and includes various modifications other than the examples of the present invention. Examples suitable for and typical of the present invention will be shown below.

Example 1

An example related to an optical disk protective film will be shown. A target was manufactured by weighing 2% by weight of $Al_2O_3$ powder and 10% by weight of $Nb_2O_5$ powder, mixing them with balance ZnO powder, and sintering the mixture in the air at 1400° C. The resultant target had a density of 5.3 $g/cm^3$.

Using the $ZnO$—$Al_2O_3$—$Nb_2O_5$ target thus obtained, sputtering was performed to form a film on a substrate. The sputtering conditions were as follows:

| | |
|---|---|
| Sputter gas: | Ar |
| Gas pressure: | 0.5 Pa |
| Substrate temperature: | room temperature |
| Film thickness: | 1500 Angstrom |

The number of substrate coating, i.e. the number of products, until particles on the internal walls of the sputtering chamber and the apparatus had to be cleaned was 3000 to 3500. This was 20%–40% improvement compared with the number of products from the Comparative Examples described below (ZnS—$SiO_2$ target).

The reflectance of the protective films was 16–18%, which sufficiently achieved the target value of 20% or less. Furthermore, the transmittance in the visible-ray region was 95%, and the properties of an effective protective film were obtained.

Figure 2:
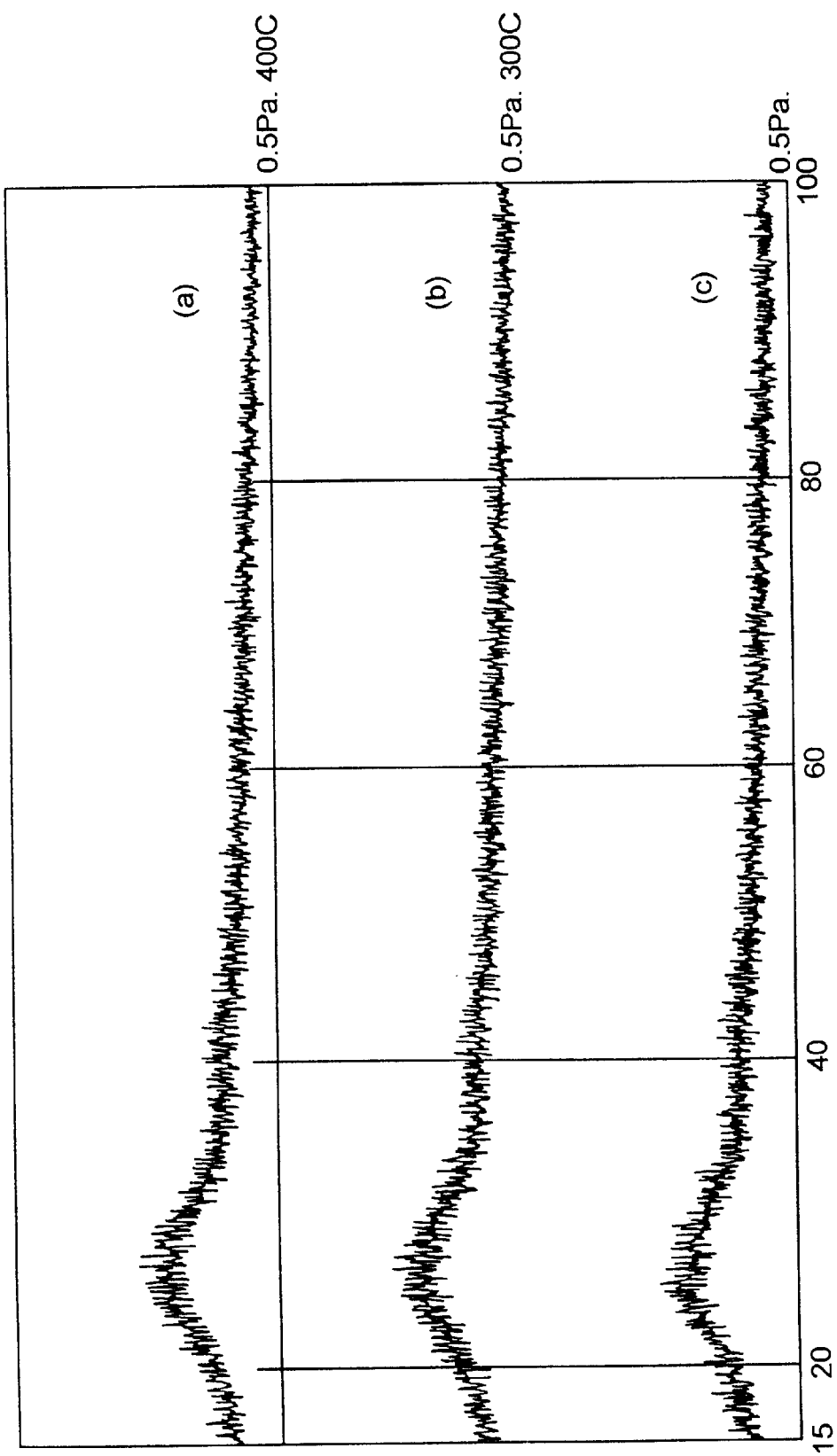
FIG. 2 is a diagram showing results of X-ray diffraction of a protective film formed by a $ZnO$—$Al_2O_3$—$Nb_2O_5$ target on the Example, heated to 300° C. and 400° C.

Also, X-ray diffraction data were reviewed to check crystallization when the protective films formed using the $ZnO-Al_2O_3-Nb_2O_5$ target of the above-described Example 1 were heated to 300° C. and 400° C. (in the air). For comparison the protective film that was not heated was also tested at the same time. The results are shown in (a) (b), and (c) of FIG. 2.

FIG. 2(a) shows crystallization when the protective films are heated to 400° C.; FIG. 2(b), to 300° C.; and FIG. 2(c), when not heated.

As obviously seen from these results, no crystallization was observed even when heated to 300° C. and 400° C. (in the air), similar to the protective film without heating. Specifically, the target of the present invention provided stable ZnO-based optical disk protective films without crystallization.

Example 2

A target was manufactured by weighing 2% by weight of $Al_2O_3$ powder and 5% by weight of $SiO_2$ powder, mixing them with balance ZnO powder, and sintering the mixture in the air at 1400° C. The resultant target had a density of 5.2 g/cm$^3$.

Using the $ZnO-Al_2O_3-SiO_2$ target thus obtained, sputtering was performed to form a film on a substrate. The number of substrate coating, i.e. the number of products, until particles on the internal walls of the sputtering chamber and the apparatus had to be cleaned was 3000 to 3500. This was 20%–40% improvement compared with the number of products from the Comparative Examples described below ($ZnS-SiO_2$ target).

The reflectance of the protective films was 16–18%, which sufficiently achieved the target value of 20% or less. Furthermore, the transmittance in the visible-ray region was 93% or more, and the properties of an effective protective film were obtained.

Also, X-ray diffraction data were reviewed to check crystallization when the protective films formed using the $ZnO-Al_2O_3-SiO_2$ target of the above-described Example 2 were heated to 300° C. (in the air). No crystallization was observed as in Example 1. Specifically, the target of the present invention provided stable ZnO-based optical disk protective films without crystallization.

Example 3

A target was manufactured by weighing 2% by weight of $Ga_2O_3$ powder and 10% by weight of $Nb_2O_5$ powder, mixing them with balance ZnO powder, and sintering the mixture in the air at 1400° C. The resultant target had a density of 5.2 g/cm$^3$.

Using the $ZnO-Ga_2O_3-Nb_2O_5$ target thus obtained, a film was formed on a substrate by direct current (DC). The number of substrate coating, i.e. the number of products, until particles on the internal walls of the sputtering chamber and the apparatus had to be cleaned was 3000 to 3500. This was 20%–40% improvement compared with the number of products from the Comparative Examples described below ($ZnS-SiO_2$ target).

The reflectance of the protective films was 16–18%, which sufficiently achieved the target value of 20% or less. Furthermore, the transmittance in the visible-ray region was 93% or more, and the properties of an effective protective film were obtained.

Also, X-ray diffraction data were reviewed to check crystallization when the protective films formed using the $ZnO-Ga_2O_3-Nb_2O_5$ target of the above-described Example 3 were heated to 300° C. (in the air). No crystallization was observed as in Examples 1 and 2. Specifically, the target of the present invention provided stable ZnO-based optical disk protective films without crystallization.

Although three examples, i.e. an example of $Al_2O_3$ and $Nb_2O_5$ added to ZnO, an example of $Al_2O_3$ and $SiO_2$ added to ZnO, and an example of $Ga_2O_3$ and $Nb_2O5$ added to ZnO, have been shown above, similar results were obtained when other oxides such as $V_2O_5$, $B_2O_3$, and $P_2O_5$, or the combination of these oxides were added.

Also the similar results were obtained when one or two of $ZrO_2$ and $TiO_2$ were added. The above Examples are typical examples.

The number of substrate coating, i.e. the number of products, until particles on the internal walls of the sputtering chamber and the apparatus had to be cleaned in the above Examples 1 to 3 and Comparative Example are collectively shown in Table 1.

TABLE 1

|  | Number of products before cleaning |
| --- | --- |
| Example 1 | 3000–3500 |
| Example 2 | 3000–3500 |
| Example 3 | 3000–3500 |
| Comparative Example | 2500 |

Comparative Example

Next, 20 mol % of $SiO_2$ powder and 80 mol % of ZnS powder were mixed, and hot-pressed in an Ar atmosphere at 1000° C. and 150 kgf/cm$^2$. The resultant target had a density of 3.4 g/cm$^3$.

Using the $ZnS-SiO_2$ target thus obtained, high frequency (RF) sputtering was performed. The number of substrate coating, i.e. the number of products, until particles on the internal walls of the sputtering chamber and the apparatus had to be cleaned was 2500. This was about 30% less than Examples.

Furthermore, the reflectance of the protective film formed by sputtering was higher, and the transmittance was lower than expected.

The deviation of the composition of formed film from the composition of the sputtering targets in the above Examples and Comparative Examples was within ±10% for each component.

The optically transparent film of the present invention, when used as an optical disk protective film, has excellent features to significantly decreasing the formation of particles, improving the uniformity of the film, and providing a protective film that has low reflectance and high transmittance in the visible region under stable production conditions at high reproducibility, by using a ZnO-based sputtering target for optical disk protective films that substitutes conventional $ZnS-SiO_2$ sputtering targets.

As described above, the protective film for optical disks, especially for phase-change type optical disks, formed using the sputtering target of the present invention has an excellent effect to form stable films without deterioration of properties of the protective film even subjected to repetitive heating-cooling heat cycles of the phase-change recording layer by laser beams.

Furthermore, as described above, the ZnO-based sputtering target of the present invention has significant features to not only provide the films of lower reflectance, but also to provide at high reproducibility the stable films that satisfy optical functions to increase the absorption of the amorphous and crystalline portions and increase the difference in reflectance, the function to prevent the deformation of recording thin films due to damp-proof or heat, and the function to control the thermal conditions during recording.

What is claimed is:

1. An optically transparent film, comprising:

0.01 to 20% by weight of at least one glass forming oxide including $P_2O_5$;

0.01 to 20% by weight of one of $Al_2O_3$ and $Ga_2O_3$, and a balance being ZnO.

2. A sputtering target for forming an optically transparent film, comprising:

0.01 to 20% by weight of at least one glass forming oxide including $P_2O_5$; and 0.01 to 20% by weight of one of $Al_2O_3$ and $Ga_2O_3$, a balance being ZnO.

3. An optically transparent film, comprising:

0.01 to 20% by weight of at least one glass forming oxide selected from a group consisting of $Nb_2O_5$ and $V_2O_5$;

0.01 to 20% by weight of $Ga_2O_3$, and a balance being ZnO.

4. An optically transparent film, comprising:

0.01 to 20% by weight of at least one glass forming oxide selected from a group consisting of $Nb_2O_5$, $V_2O_5$, $B_2O_3$, $SiO_2$ and $P_2O_5$;

0.01 to 20% by weight of one of $Al_2O_3$ and $Ga_2O_3$;

0.01 to 5% by weight of a hard oxide including $ZrO_2$; and a balance being ZnO.

5. A sputtering target for forming an optically transparent film, comprising:

0.01 to 20% by weight of at least one glass forming oxide selected from a group consisting of $Nb_2O_5$ and $V_2O_5$; and 0.01 to 20% by weight of $Ga_2O_3$, a balance being ZnO.

6. A sputtering target for forming an optically transparent film, comprising:

0.01 to 20% by weight of at least one glass forming oxide selected from a group consisting of $Nb_2O_5$, $V_2O_5$, $B_2O_3$, $SiO_2$ and $P_2O_5$;

0.01 to 20% by weight of one of $Al_2O_3$ and $Ga_2O_3$;

0.01 to 5% by weight of a hard oxide including $ZrO_2$; and a balance being ZnO.

7. An optical disc, comprising:

a recording layer on which information is written by irradiation of laser beams which cause crystallographic phase change of a structure of said recording layer and from which information is read by sensing a change in reflectance of said recording layer between said crystallographic phase changes of said structure; and a pair of optically transparent protective films located on opposite sides of said recording layer to sandwich said recording layer therebetween, each of said optically transparent protective films having 0.01 to 20% by weight of at least one glass forming oxide selected from a group consisting of $Nb_2O_5$, $V_2O_5$, $B_2O_3$, $SiO_2$ and $P_2O_5$; 0.01 to 20% by weight of one of $Al_2O_3$ and $Ga_2O_3$; and a balance of ZnO.

* * * * *